United States Patent
Fukuzumi

(10) Patent No.: US 7,468,541 B2
(45) Date of Patent: Dec. 23, 2008

(54) MAGNETIC RANDOM ACCESS MEMORY

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 520 days.

(21) Appl. No.: 11/224,094

(22) Filed: Sep. 13, 2005

(65) Prior Publication Data

US 2006/0181813 A1   Aug. 17, 2006

(30) Foreign Application Priority Data

Feb. 17, 2005   (JP) .............................. 2005-040891

(51) Int. Cl.
*H01L 29/82* (2006.01)
(52) U.S. Cl. ........................................ 257/421; 438/38
(58) Field of Classification Search .................. 257/1, 257/296
See application file for complete search history.

(56) References Cited

U.S. PATENT DOCUMENTS

| | | | | |
|---|---|---|---|---|
| 6,072,718 | A * | 6/2000 | Abraham et al. | 365/173 |
| 6,480,411 | B1 * | 11/2002 | Koganei | 365/158 |
| 2002/0001223 | A1 * | 1/2002 | Saito et al. | 365/158 |
| 2002/0153580 | A1 * | 10/2002 | Hosotani et al. | 257/421 |
| 2003/0199104 | A1 * | 10/2003 | Leuschner et al. | 438/3 |
| 2004/0021189 | A1 * | 2/2004 | Yoda et al. | 257/421 |
| 2005/0020053 | A1 * | 1/2005 | Butcher et al. | 438/618 |
| 2005/0040447 | A1 | 2/2005 | Fukuzumi | |
| 2005/0152180 | A1 * | 7/2005 | Katti | 365/158 |
| 2005/0185454 | A1 * | 8/2005 | Brown et al. | 365/171 |
| 2006/0181813 | A1 | 8/2006 | Fukuzumi | |

FOREIGN PATENT DOCUMENTS

| JP | 2004-128229 | * | 4/2004 |
|---|---|---|---|
| JP | 2005-64075 | | 3/2005 |

OTHER PUBLICATIONS

U.S. Appl. No. 10/895,074, filed Jul. 21, 2004, Yoshiaki Fukuzumi et al.
U.S. Appl. No. 11/224,094, filed Sep. 13, 2005, Fukuzumi.
U.S. Appl. No. 11/378,358, filed Mar. 20, 2006, Kai et al.
U.S. Appl. No. 11/389,110, filed Mar. 27, 2006, Nakayama et al.
U.S. Appl. No. 12/019,657, filed Jan. 25, 2008, Kai et al.
U.S. Appl. No. 12/037,726, filed Feb. 26, 2008, Nakayama et al.

* cited by examiner

*Primary Examiner*—N Drew Richards
*Assistant Examiner*—Mamadou Diallo
(74) *Attorney, Agent, or Firm*—Oblon, Spivak, McClelland, Maier & Neustadt, P.C.

(57) ABSTRACT

A magnetic random access memory includes a magnetic recording element which includes a fixed layer whose magnetization direction is fixed, a recording layer whose magnetization direction changes, and a nonmagnetic layer provided between the fixed layer and the recording layer, the recording layer having a first running portion, a first projecting portion and a second projecting portion, the first running portion which runs in a direction of axis of easy magnetization, the first and second projecting portions which project from two side surfaces of the first running portion, a mask layer which is arranged above the first running portion, and a first sidewall layer and a second sidewall layer which are formed on two side surfaces of the mask layer, respectively, and arranged on the first projecting portion and the second projecting portion, respectively.

20 Claims, 14 Drawing Sheets

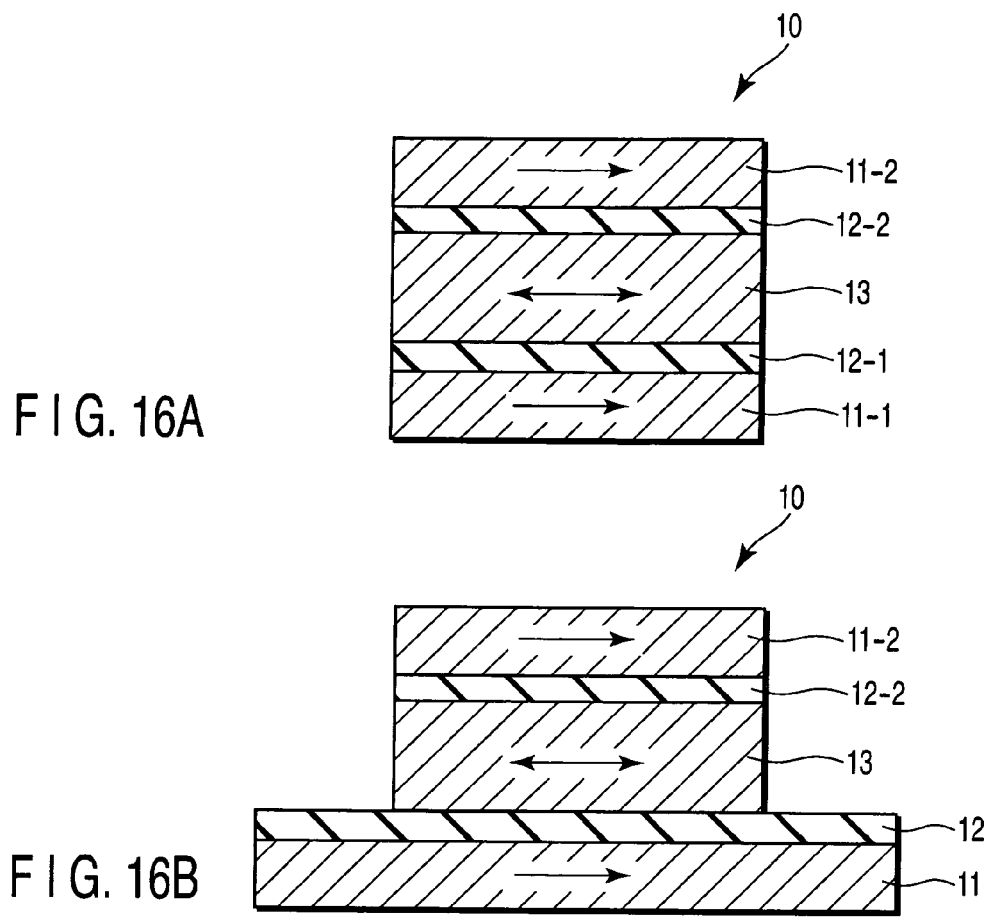
FIG. 16A
FIG. 16B
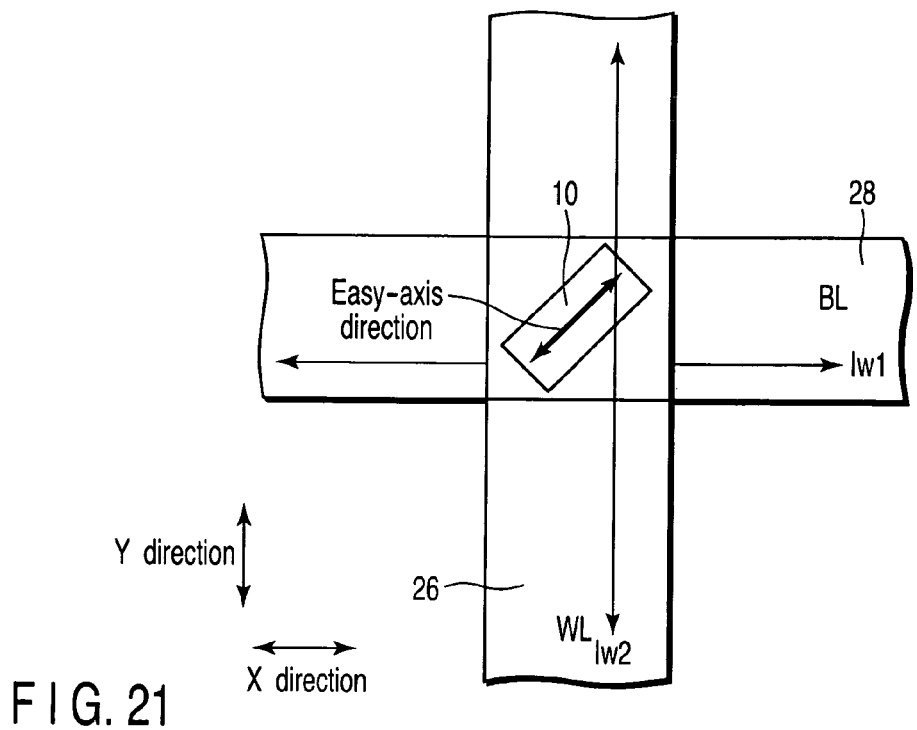
FIG. 21

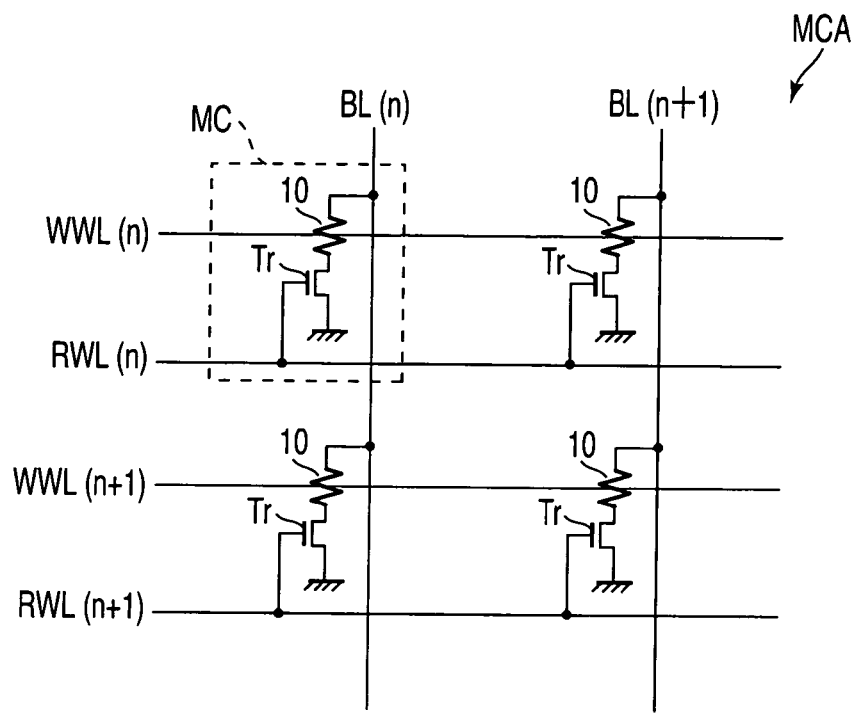
F I G. 18A
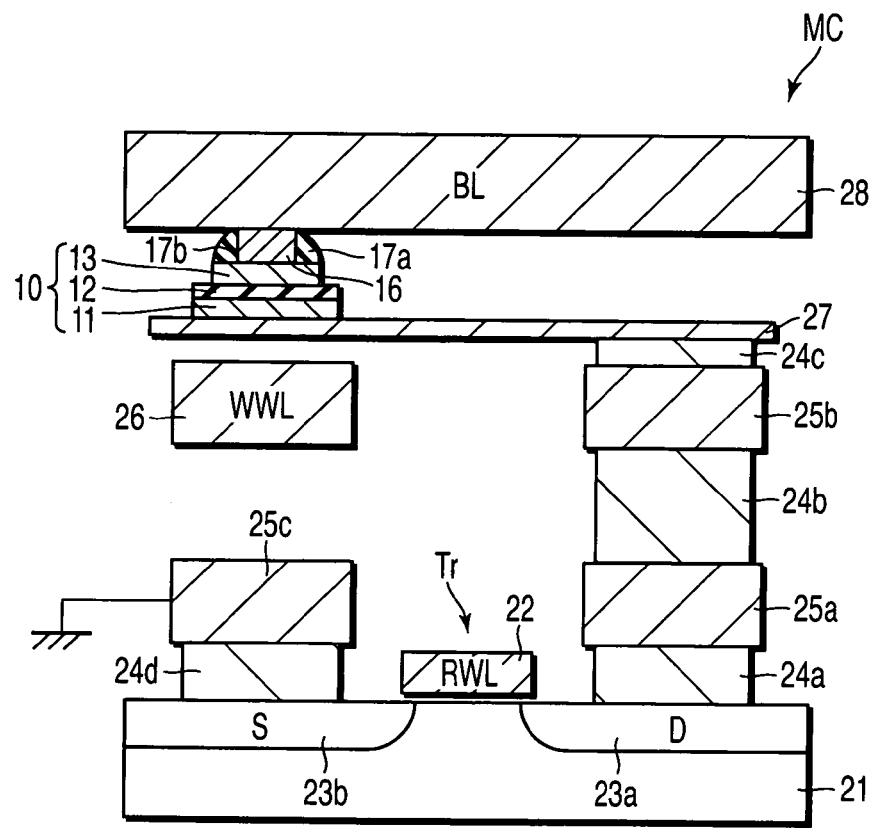
F I G. 18B

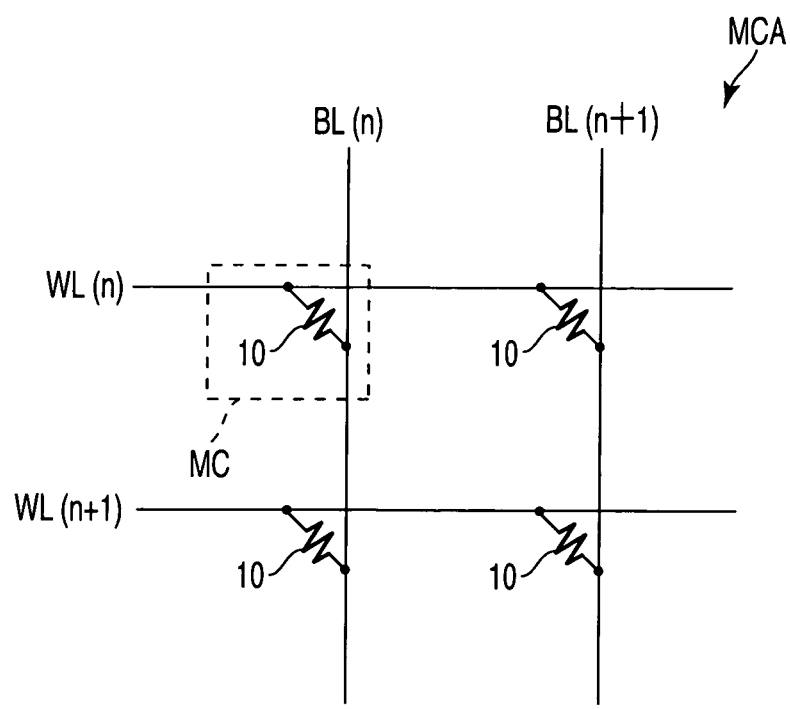
F I G. 20A
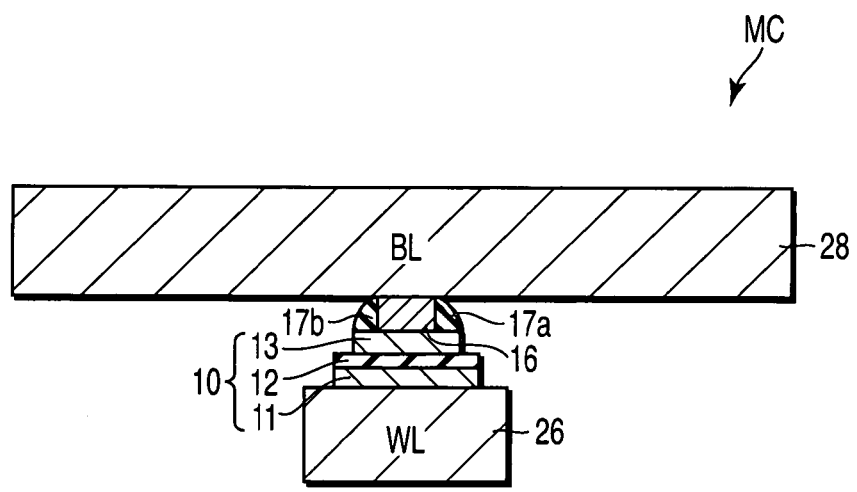
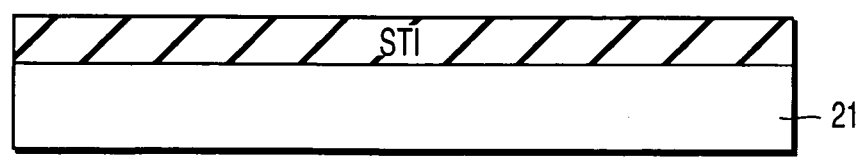
F I G. 20B

MAGNETIC RANDOM ACCESS MEMORY

CROSS-REFERENCE TO RELATED APPLICATIONS

This application is based upon and claims the benefit of priority from prior Japanese Patent Application No. 2005-040891, filed Feb. 17, 2005, the entire contents of which are incorporated herein by reference.

BACKGROUND OF THE INVENTION

1. Field of the Invention

The present invention relates to a magnetic random access memory having a magnetoresistive element.

2. Description of the Related Art

In recent years, magnetic random access memories (MRAMs) using the tunnel magnetoresistive (TMR) effect have been proposed as a type of semiconductor memory.

A memory cell of the magnetic random access memory comprises a magnetic tunnel junction (MTJ) element which has a fixed layer, recording layer, and tunnel barrier layer sandwiched between them. It has been found as a result of examination of the MTJ element that the asteroid characteristic can be improved by widening the planar shape of the MTJ element in the hard- and easy-axis directions, i.e., by forming a cross-shaped MTJ element.

However, it is difficult to actually form a cross-shaped MTJ element by processes for mass production. For example, the MTJ element is processed in two steps by using two masks M1 and M2, i.e., the mask M1 which runs in the easy-axis direction (long-axis direction of the MTJ element) and the mask M2 which runs in the hard-axis direction (short-axis direction of the MTJ element). However, when the shapes of the two masks M1 and M2 are simply superposed, the margin for misalignment in the hard-axis direction is small, and the desired asteroid characteristic can not be obtained.

It is an object of the present invention to provide a magnetic random access memory which can suppress misalignment of a portion projecting in the easy-axis direction and improve the asteroid characteristic in a so-called cross-shaped magnetic recording element.

BRIEF SUMMARY OF THE INVENTION

A magnetic random access memory according to an aspect of the present invention comprises a magnetic recording element which includes a fixed layer whose magnetization direction is fixed, a recording layer whose magnetization direction changes, and a nonmagnetic layer provided between the fixed layer and the recording layer, the recording layer having a first running portion, a first projecting portion and a second projecting portion, the first running portion which runs in a direction of axis of easy magnetization, the first and second projecting portions which project from two side surfaces of the first running portion, a mask layer which is arranged above the first running portion, and a first sidewall layer and a second sidewall layer which are formed on two side surfaces of the mask layer, respectively, and arranged on the first projecting portion and the second projecting portion, respectively.

BRIEF DESCRIPTION OF THE SEVERAL VIEWS OF THE DRAWING

FIGS. 1A and 1B are views showing a magnetic random access memory according to a first embodiment of the present invention, in which FIG. 1A is a plan view, and FIG. 1B is a sectional view taken along a line IB-IB in FIG. 1A;

FIGS. 14A and 14B are views showing a fixed layer according to a sixth embodiment of the present invention, in which FIG. 14A is a plan view, and FIG. 14B is a perspective view;

FIGS. 15A and 15B are views showing the fixed layer according to the sixth embodiment of the present invention, in which FIG. 15A is a plan view, and FIG. 15B is a perspective view;

FIGS. 16A and 16B are sectional views showing double junction structures of an MTJ element according to a seventh embodiment of the present invention;

FIGS. 18A and 18B are views showing select transistor memory cells of a magnetic random access memory according to an eighth embodiment of the present invention, in which FIG. 18A is a circuit diagram showing the memory cell array, and FIG. 18B is a sectional view showing one cell;

FIGS. 19A and 19B are views showing select diode memory cells of the magnetic random access memory according to the eighth embodiment of the present invention, in which FIG. 19A is a circuit diagram showing the memory cell array, and FIG. 19B is a sectional view showing one cell;

FIGS. 20A and 20B are views showing cross-point memory cells of the magnetic random access memory according to the eighth embodiment of the present invention, in which FIG. 20A is a circuit diagram showing the memory cell array, and FIG. 20B is a sectional view showing one cell; and FIG. 21 is a plan view showing a toggle memory cell of the magnetic random access memory according to the eighth embodiment of the present invention.

DETAILED DESCRIPTION OF THE INVENTION

Figure 1A:
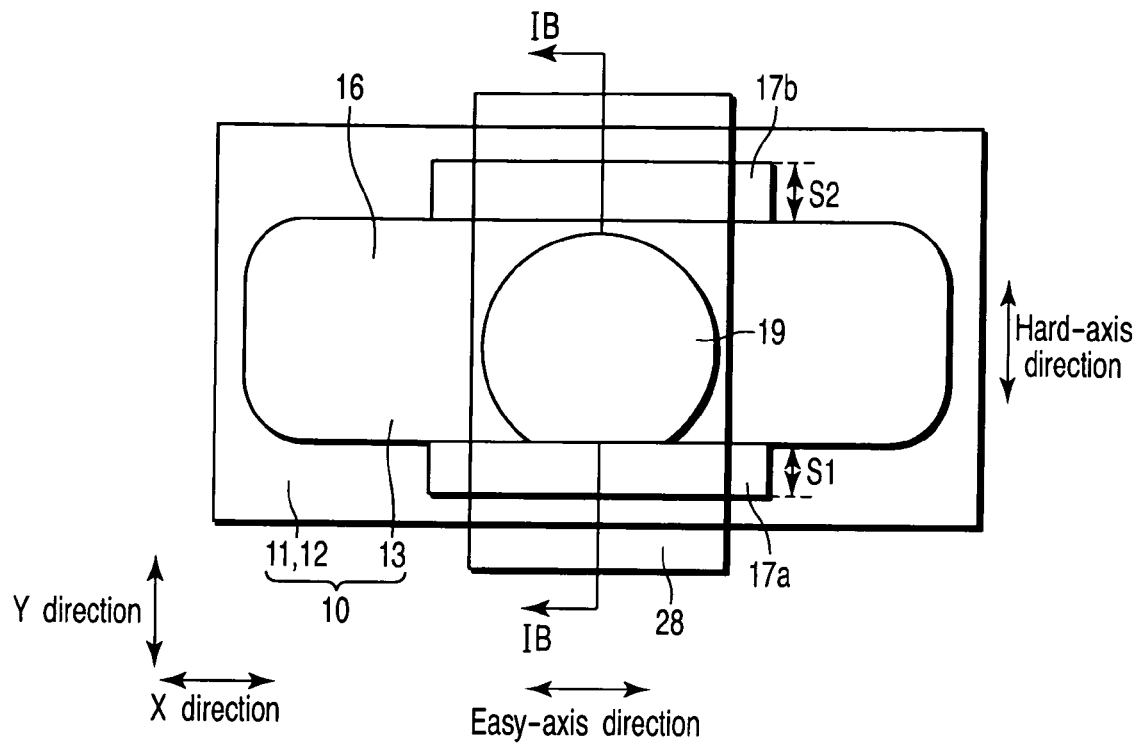

The embodiments of the present invention will be described below with reference to the accompanying drawing. The same reference numerals denote the same parts throughout the drawing.

First Embodiment

In the first embodiment, a magnetic tunnel junction (MTJ) element serving as a magnetic recording element has a so-called cross shape. The portion projecting in the short-axis direction is self-aligned by using two parallel sidewall layers along the long-axis direction of the MTJ element.

Figure 1B:
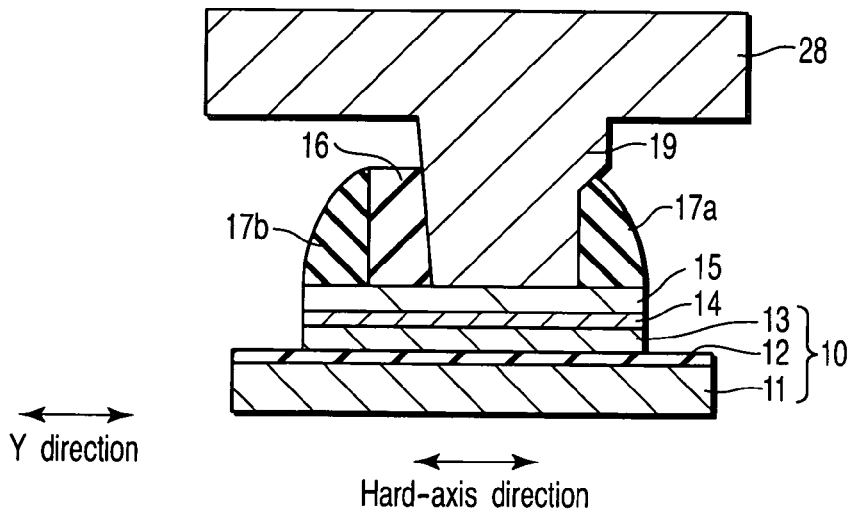
Figure 2:
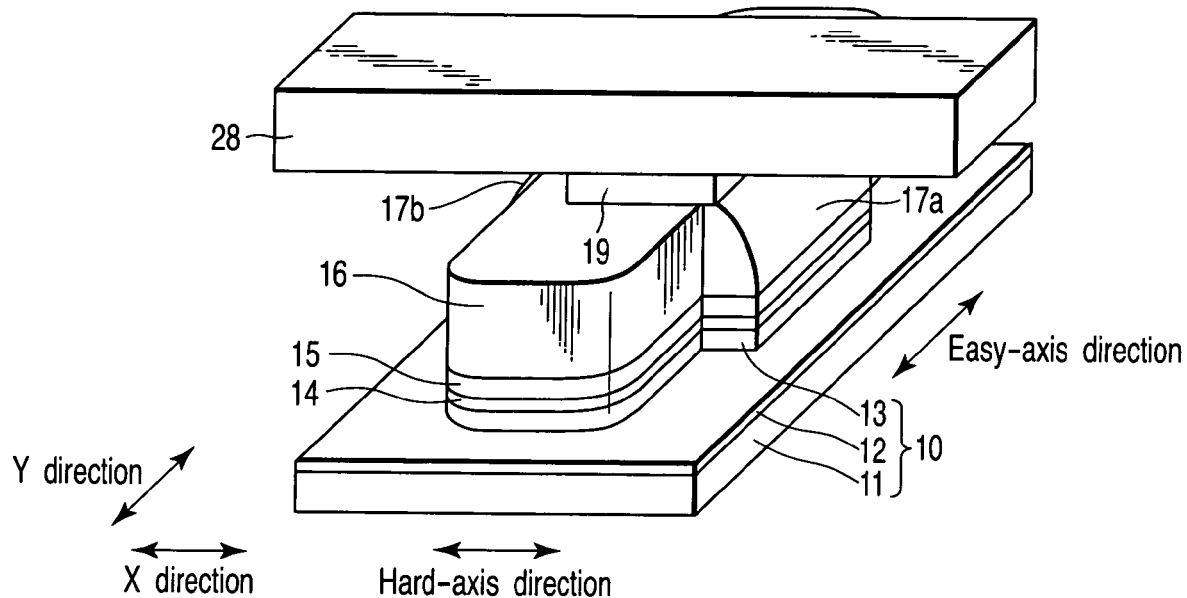
FIG. 2 is a perspective view showing the magnetic random access memory according to the first embodiment of the present invention.
Figure 3:
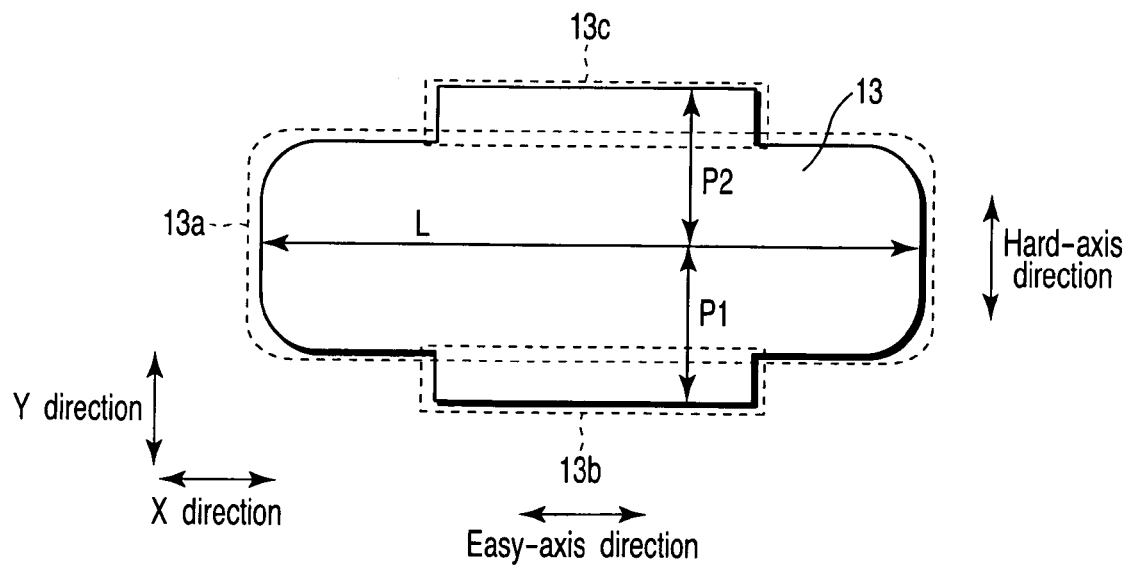
FIG. 3 is a plan view showing a cross-shaped recording layer according to the first embodiment of the present invention.

FIGS. 1A and 1B are plan and sectional views of a magnetic random access memory according to the first embodiment of the present invention. FIG. 2 is a perspective view of the magnetic random access memory according to the first embodiment of the present invention. FIG. 3 is a plan view of a cross-shaped recording layer according to the first embodiment of the present invention. The magnetic random access memory according to the first embodiment will be described below.

As shown in FIGS. 1A, 1B, 2, and 3, an MTJ element 10 has a fixed layer (pinned layer) 11 having a fixed magnetization direction, a recording layer (free layer) 13 having a reversed magnetization direction, and a nonmagnetic layer 12 (e.g., a tunnel barrier layer) sandwiched between the fixed layer 11 and the recording layer 13. An anti-diffusion film 14 is provided on the MTJ element 10. A stopper film 15 is provided on the anti-diffusion film 14. An insulating mask layer 16 is provided on the stopper film 15. A pair of insulating sidewall layers 17a and 17b is provided on the Y-direction side surfaces of the mask layer 16.

The planar shape of the recording layer 13 is a so-called cross shape. The cross planar shape includes a running portion 13a which runs in the X direction, and projecting portions 13b and 13c which project in the Y direction from the Y-direction (e.g., direction perpendicular to the X direction) side surfaces of the running portion 13a. Since the running direction of the running portion 13a is the long-axis direction, the X direction is the direction of axis of easy magnetization. Since the projecting direction of the projecting portions 13b and 13c is the short-axis direction, the Y direction is the direction of axis of hard magnetization.

A distance P1 from a central axis (axis which passes through the center of the width in the Y direction) L of the running portion 13a to the Y-direction end face of the projecting portion 13b almost equals a distance P2 from the central axis L of the running portion 13a to the Y-direction end face of the projecting portion 13c. That is, misalignment of the projecting portions 13b and 13c in the hard-axis direction of the MTJ element 10 is suppressed.

The fixed layer 11 has a rectangular planar shape. The planar shape of the fixed layer 11 is larger than that of the recording layer 13.

The mask layer 16 is arranged above the running portion 13a. The planar shape of the mask layer 16 is almost the same as that of the running portion 13a. The mask layer 16 and running portion 13a have an elliptical planar shape having a short-axis in, e.g., the X direction.

The sidewall layers 17a and 17b are arranged above the projecting portions 13b and 13c. The planar shapes of the sidewall layers 17a and 17b are almost the same as those of the projecting portions 13b and 13c. The sidewall layers 17a and 17b and projecting portions 13b and 13c have a rectangular planar shape having a long side in, e.g., the X direction.

The sidewall layers 17a and 17b are provided at parts of the Y-direction side surfaces of the mask layer 16. The sidewall layers 17a and 17b oppose through the mask layer 16. A Y-direction length S1 of the sidewall layer 17a almost equals a Y-direction length S2 of the sidewall layer 17b.

The planar shape of each of the anti-diffusion film 14 and stopper film 15 is a so-called cross shape, like the recording layer 13. The nonmagnetic layer 12 of the MTJ element 10 has the same rectangular planar shape as the fixed layer 11.

An upper wiring 28 is arranged above the MTJ element 10 and electrically connected to the MTJ element 10. More specifically, a via 19 is connected to the upper wiring 28. The via 19 extends through the mask layer 16 and is connected to the MTJ element 10 through the stopper film 15 and anti-diffusion film 14. The via 19 may partially overlap the sidewall layer 17a.

An anti-ferromagnetic layer to fix the magnetization direction of the fixed layer 11 may be provided under the fixed layer 11 of the MTJ element 10.

In the above-described magnetic random access memory, the constituent elements are made of, e.g., the following materials.

The following ferromagnetic materials are used for the fixed layer 11 and recording layer 13. For example, Fe, Co, Ni, a layered film thereof, an alloy thereof, magnetite having a high spin polarizability, an oxide such as $CrO_2$ or $RXMnO_{3-Y}$ (R: rare earth, X: Ca, Ba, or Sr), or a Heusler alloy such as NiMnSb or PtMnSb is preferably used. The magnetic materials may contain a small amount of nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

For the nonmagnetic layer 12, various dielectric materials such as $Al_2O_3$, $SiO_2$, MgO, AlN, $Bi_2O_3$, $MgF_2$, $CaF_2$, $SrTiO_2$, or $AlLaO_3$ can be used. These dielectric materials may contain oxygen, nitrogen, or fluorine defects.

The anti-diffusion film 14 is a layer provided to prevent diffusion between the recording layer 13 and the mask layer 16 and is made of, e.g., Ru, alumina, or a nitride (ZrN, TiN, or TaN).

The stopper film 15 is a film provided to serve as an etching stopper in forming the via 19 and is made of, e.g., TiN.

The mask layer 16 is formed from, e.g., an SiN film or $SiO_2$ film.

The sidewall layers 17a and 17b are preferably made of a material capable of ensuring an etching selectivity with respect to the mask layer 16. That is, the sidewall layers are preferably made of a material different from the mask layer 16. In addition, the sidewall layers 17a and 17b are preferably made of a material capable of ensuring an etching selectivity with respect to an interlayer insulating film which is buried around the MTJ element 10. That is, the sidewall layers are preferably made of a material different from the interlayer insulating film. The sidewall layers 17a and 17b are made of, e.g., SiN, $SiO_2$, or AlO.

As the material of the interlayer insulating film around the MTJ element 10, for example, an $SiO_2$ film or SiN film can be used.

FIGS. 4 to 9 are perspective views showing steps in manufacturing the magnetic random access memory according to the first embodiment of the present invention. The method of manufacturing the magnetic random access memory according to the first embodiment of the present invention will be described below.

Figure 4:
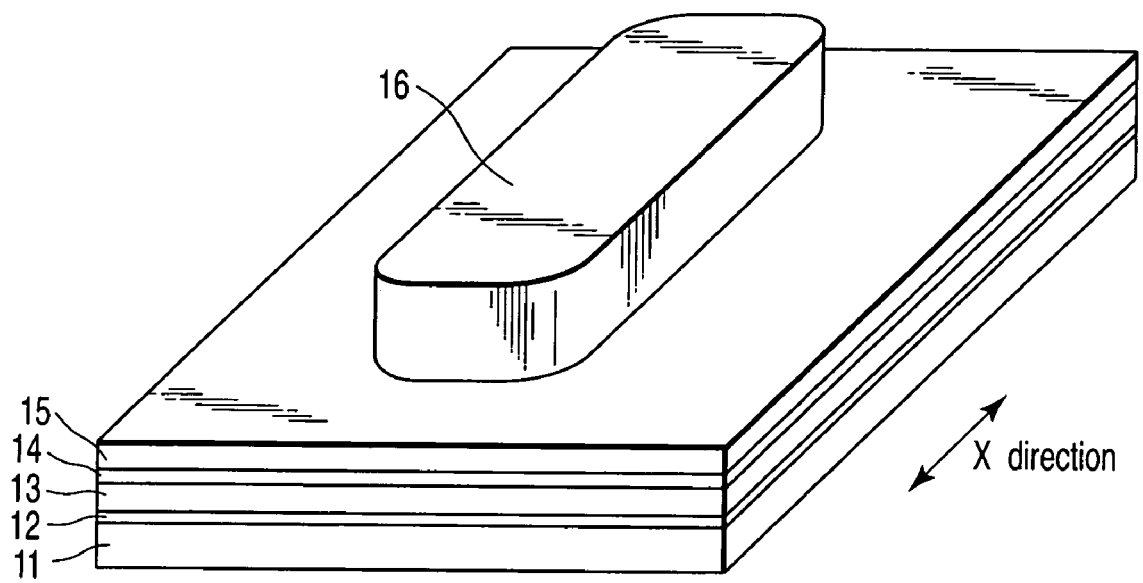
FIGS. 4, 5, 6, 7, 8 and 9 are perspective views showing steps in manufacturing the magnetic random access memory according to the first embodiment of the present invention.

As shown in FIG. 4, the fixed layer 11, nonmagnetic layer 12, recording layer 13, anti-diffusion film 14, stopper film 15, and mask layer 16 are sequentially deposited. The mask layer 16 is processed into the first shape by lithography and reactive ion etching (RIE). The first shape is, e.g., an elliptical shape having a short-axis in the X direction, i.e., the direction of axis of easy magnetization of the MTJ element 10.

Figure 5:
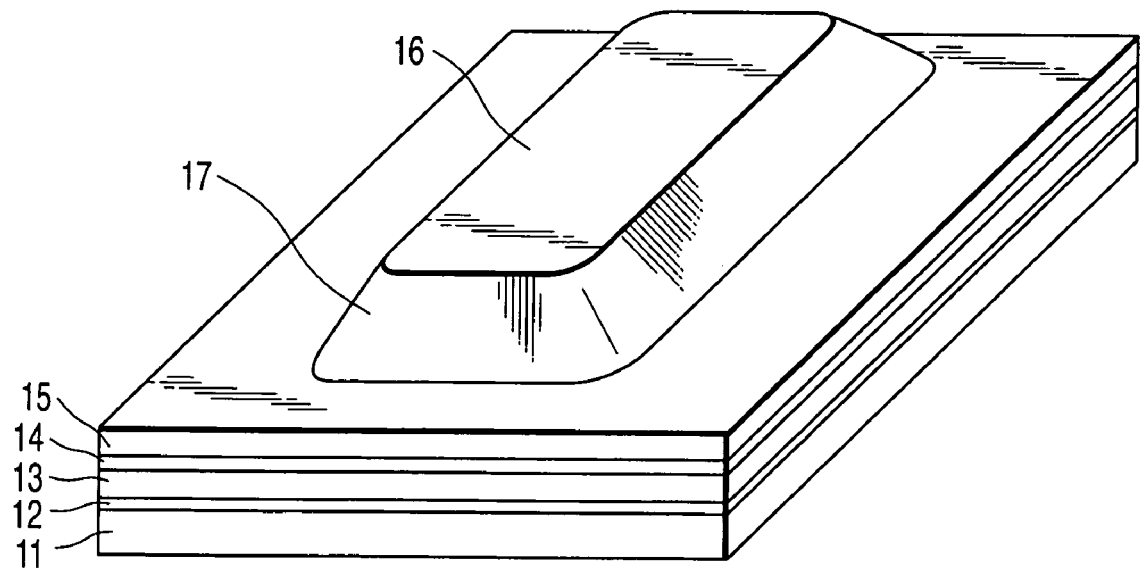

As shown in FIG. 5, a sidewall layer 17 made of, e.g., an SiN film is deposited. The sidewall layer 17 is etched by, e.g., RIE. With this process, the sidewall layer 17 remains on the entire side surfaces of the mask layer 16.

Figure 6:
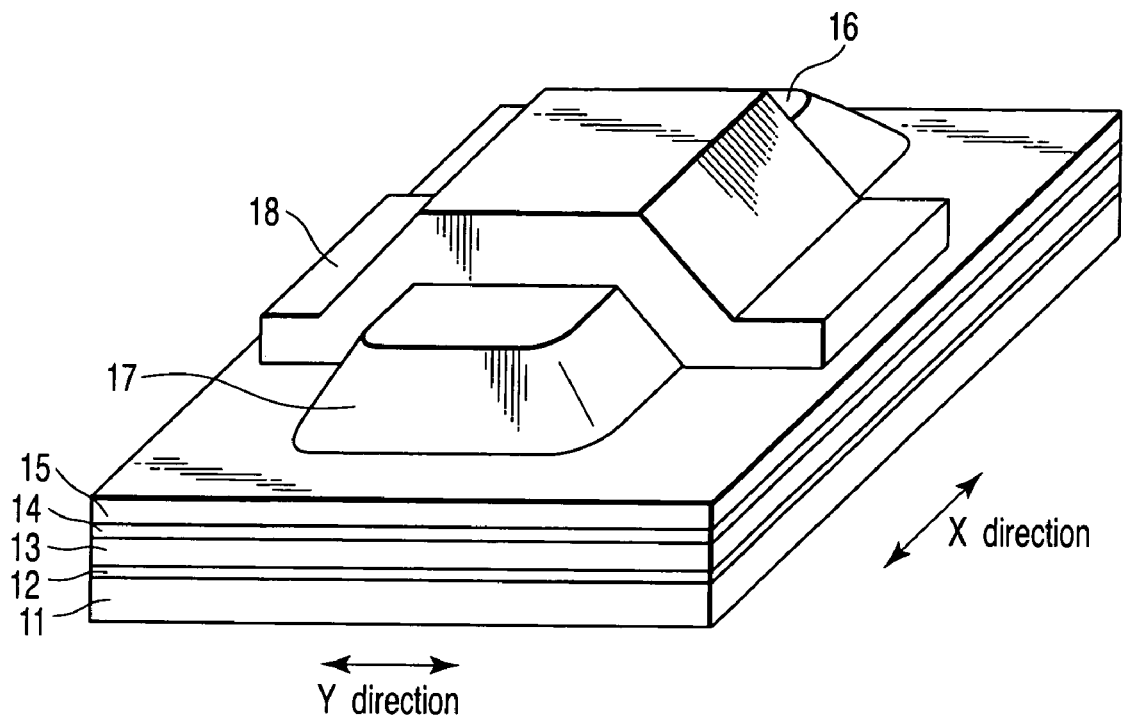

As shown in FIG. 6, a photoresist 18 having the second shape is formed by lithography. The second shape is, e.g., rectangular or elliptical, having a short-axis in the Y direction perpendicular to the X direction.

Figure 7:
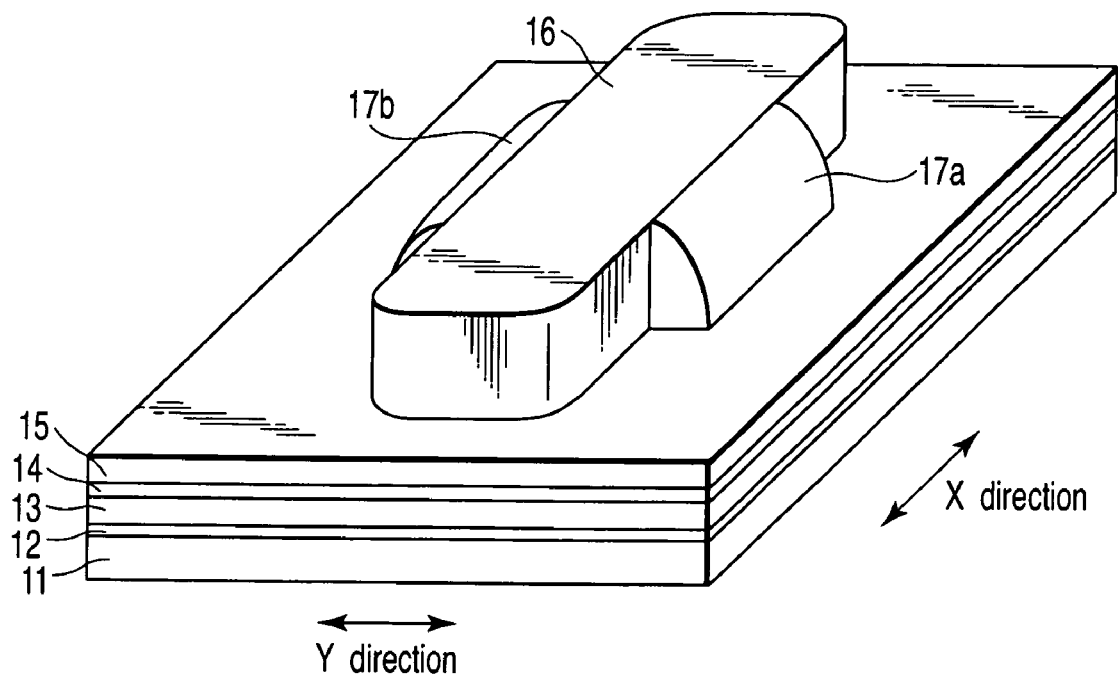

As shown in FIG. 7, the sidewall layer 17 exposed from the photoresist 18 is removed by using the photoresist 18 as a mask. With this process, the pair of sidewall layers 17a and 17b is formed at parts of the Y-direction side surface of the mask layer 16. After that, the photoresist 18 is removed.

Figure 8:
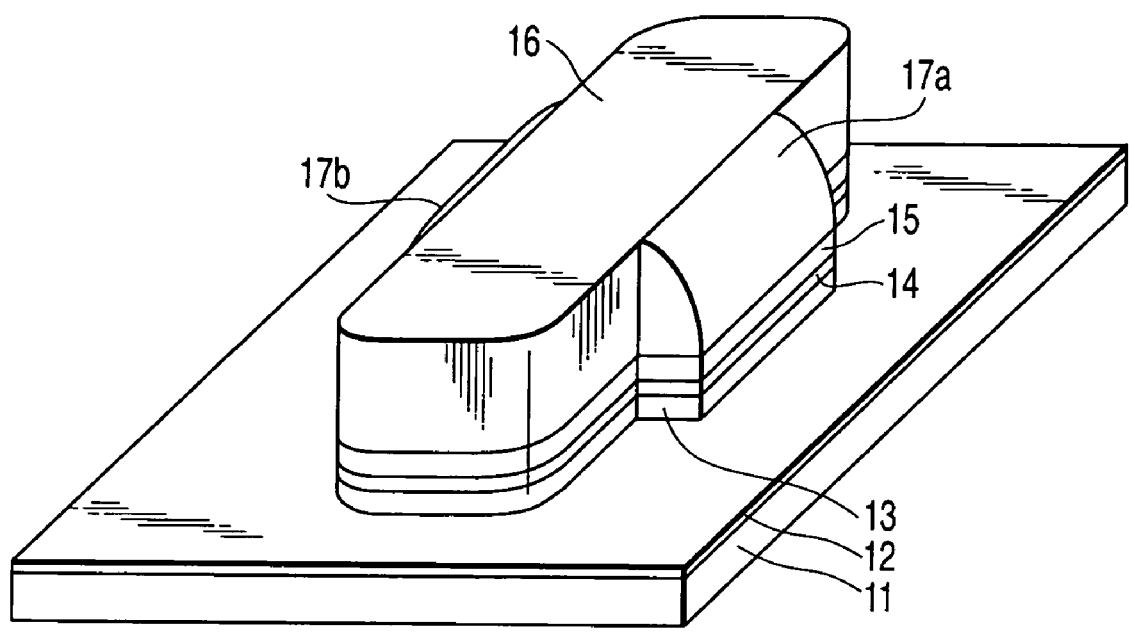

As shown in FIG. 8, the recording layer 13, anti-diffusion film 14, and stopper film 15 are etched by, e.g., RIE by using the sidewall layers 17a and 17b and mask layer 16. The projecting portions of the so-called cross-shaped recording layer 13 are self-aligned.

Figure 9:
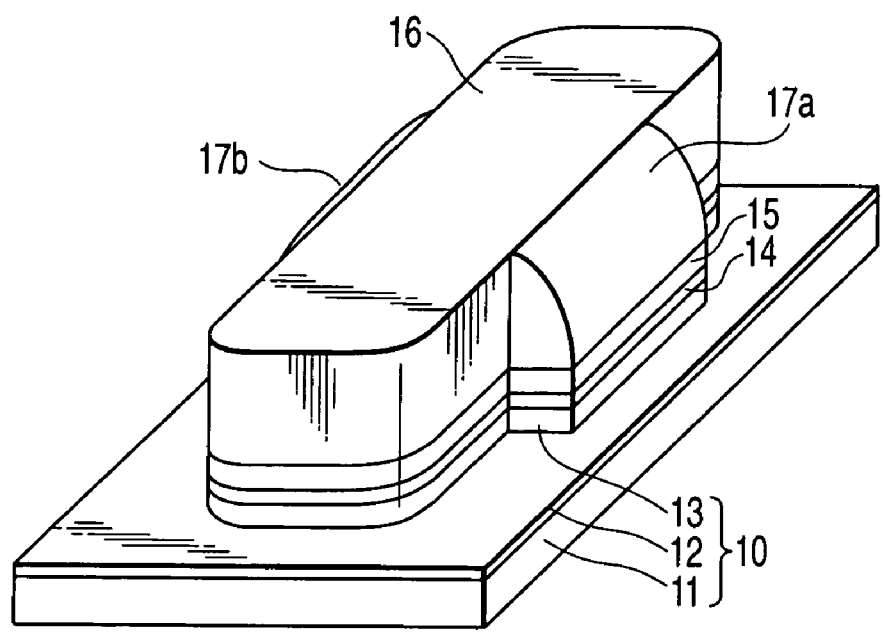

As shown in FIG. 9, the fixed layer 11 and nonmagnetic layer 12 are etched by, e.g., RIE and processed into a predetermined shape.

Next, as shown in FIG. 2, an interlayer insulating film (not shown) is deposited. The upper surface of the interlayer insulating film is planarized. The mask layer 16 is selectively removed by RIE. A conductive material is buried. By this process, the via 19 which is electrically connected to the MTJ element 10 is formed. Finally, the upper wiring 28 connected to the via 19 is formed. The via 19 and upper wiring 28 may be formed by the dual damascene process.

According to the first embodiment, the mask layer 16 is formed on the MTJ element 10. The pair of sidewall layers 17a and 17b is formed on the side surfaces of the mask layer 16. After that, the MTJ element 10 is processed by using the mask layer 16 and sidewall layers 17a and 17b, thereby forming the so-called cross-shaped MTJ element 10. For this reason, the projecting portions 13b and 13c can be self-aligned with respect to the running portion 13a by the sidewall layers 17a and 17b. Hence, misalignment of the projecting portions 13b and 13c which projects in the short-axis direction (hard-axis direction) can be suppressed, and the asteroid characteristic can be improved. As described above, according to the first embodiment, the cross-shaped MTJ element 10 having a high write error resistance can be formed by a relatively short process.

In forming the via 19 by RIE to connect the MTJ element 10 and upper wiring 28, the sidewall layers 17a and 17b can prevent the interlayer insulating film on the side surfaces of the MTJ element 10 from being etched over the sidewall layers 17a and 17b. Since the sidewall layers 17a and 17b can suppress misalignment in lithography in the short-axis direction (direction of axis of hard magnetization) in which the misalignment margin between the MTJ element 10 and the via 19 is small, the yield in short of the MTJ elements 10 can greatly be increased.

Second Embodiment

In the second embodiment, a conductive mask layer is connected directly to an upper wiring without using any via to connect an MTJ element and upper wiring.

Figure 10:
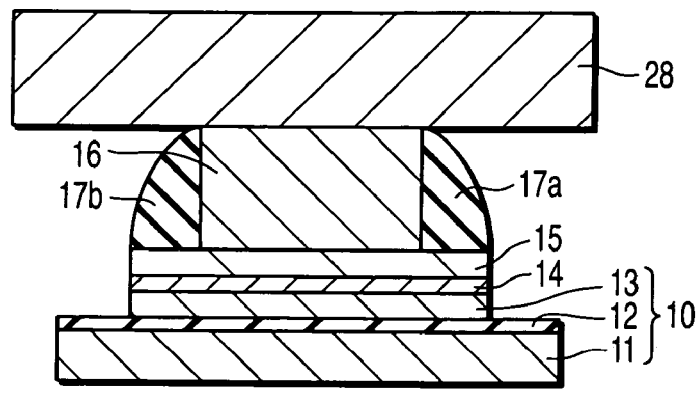
FIG. 10 is a sectional view showing a magnetic random access memory according to a second embodiment of the present invention.

FIG. 10 is a sectional view of a magnetic random access memory according to the second embodiment of the present invention. The magnetic random access memory according to the second embodiment will be described below.

As shown in FIG. 10, the second embodiment is different from the first embodiment in that no via is used to connect an MTJ element 10 and upper wiring 28. A mask layer 16 is made of a conductive material. The upper wiring 28 is connected directly to the mask layer 16, thereby electrically connecting the upper wiring 28 to the MTJ element 10. That is, the mask layer 16 serves as a via. Examples of the material of the conductive mask layer 16 are Al and Cu.

According to the second embodiment, the same effect as in the first embodiment can be obtained. In addition, in the second embodiment, since no via is used, the via formation step can be omitted.

Third Embodiment

In the third embodiment, an upper wiring and MTJ element are connected without using any via, as in the second embodiment. Conductive sidewall layers are connected directly to the upper wiring.

Figure 11:
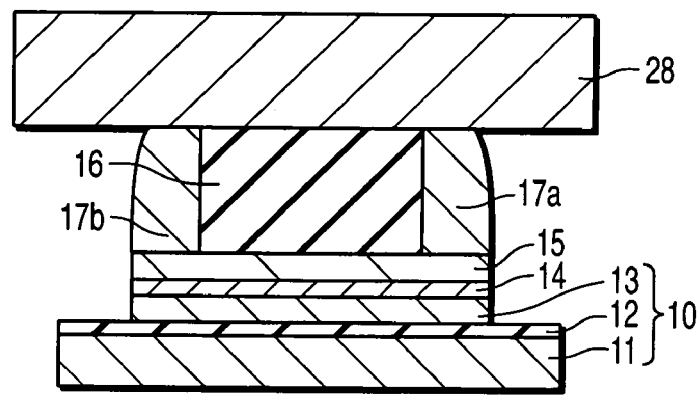
FIG. 11 is a sectional view showing a magnetic random access memory according to a third embodiment of the present invention.

FIG. 11 is a sectional view of a magnetic random access memory according to the third embodiment of the present invention. The magnetic random access memory according to the third embodiment will be described below.

As shown in FIG. 11, the third embodiment is different from the second embodiment in that a mask layer 16 is made of an insulating material, and sidewall layers 17a and 17b are made of a conductive material and connected directly to an upper wiring 28. Examples of the material of the conductive sidewall layers 17a and 17b are nonmagnetic metals such as Al, Cu, W, and Ta.

According to the third embodiment, since no via is used, the same effect as in the second embodiment can be obtained.

Additionally, in the third embodiment, when a conductive material is used for the sidewall layers 17a and 17b, the mask layer 16 can be formed from an insulating material. Since the mask layer 16 need not use a metal which is relatively hard to control its shape by RIE, the shape of the thick mask layer 16 can be easily controlled.

Fourth Embodiment

In the fourth embodiment, an upper wiring and MTJ element are connected without using any via, as in the second embodiment. Sidewall layers made of a magnetic material are connected directly to a yoke layer provided around the upper wiring.

Figure 12:
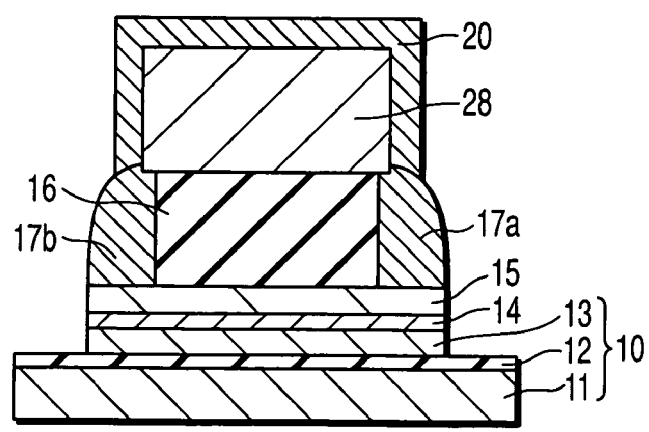
FIG. 12 is a sectional view showing a magnetic random access memory according to a fourth embodiment of the present invention.

FIG. 12 is a sectional view of a magnetic random access memory according to the fourth embodiment of the present invention. The magnetic random access memory according to the fourth embodiment will be described below.

As shown in FIG. 12, the fourth embodiment is different from the first embodiment in that a yoke layer 20 made of a magnetic material is provided on the upper and side surfaces of an upper wiring 28 and connected directly to sidewall layers 17a and 17b made of a magnetic material. With this structure, the upper wiring 28 and an MTJ element 10 are electrically connected through the yoke layer 20, sidewall layers 17a and 17b, a stopper film 15, and an anti-diffusion film 14. As the magnetic material of the yoke layer 20 and sidewall layers 17a and 17b, the same material as that of the above-described recording layer 13 or fixed layer 11 can be used. A barrier metal containing a nonmagnetic element such as Ta or Ti may be stacked as needed. A mask layer 16 is made of an insulating material. However, the mask layer 16 may be formed from a conductive material.

According to the fourth embodiment, since no via is used, the same effect as in the second embodiment can be obtained.

The yoke layer 20 is provided around the upper wiring 28. The yoke layer 20 contacts the sidewall layers 17a and 17b. In the write operation, when a magnetic field is generated by supplying a write current to the upper wiring 28, the magnetic field closes in the vertical direction of the drawing surface.

Hence, the magnetic field can be confined near the MTJ element 10. Since a stronger magnetic field can be applied to the MTJ element 10, the write margin can be widened, and the write current can be reduced.

Fifth Embodiment

In the fifth embodiment, examples of the planar shape of the recording layer of an MTJ element will be described. The planar shapes of the recording layer according to this embodiment can be applied to other embodiments.

FIGS. 13A to 13D are plan views of the recording layer according to the fifth embodiment of the present invention. The planar shape of the recording layer is not limited to that shown in FIG. 1A and can be variously changed, as will be described below.

As shown in FIGS. 13A to 13D, a recording layer 13 has a so-called cross planar shape. The cross shape includes a running portion 13a which runs in the X direction (direction of axis of easy magnetization) and projecting portions 13b and 13c which project in the Y direction from the Y-direction (direction of axis of hard magnetization) side surfaces of the running portion 13a.

Figure 13A:
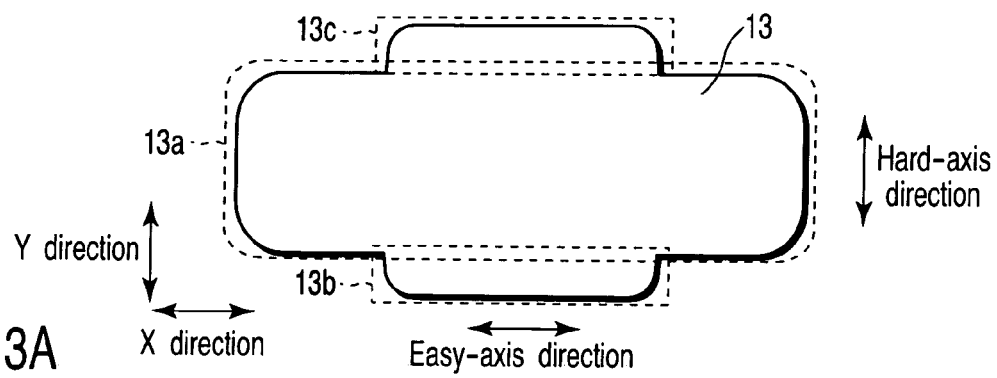
FIGS. 13A to 13D are plan views showing a recording layer according to a fifth embodiment of the present invention.

As shown in FIG. 13A, the corners of the projecting portions 13b and 13c need not always be angular and may be rounded. That is, the recording layer may have the shape of two ellipses which cross each other.

Figure 13B:
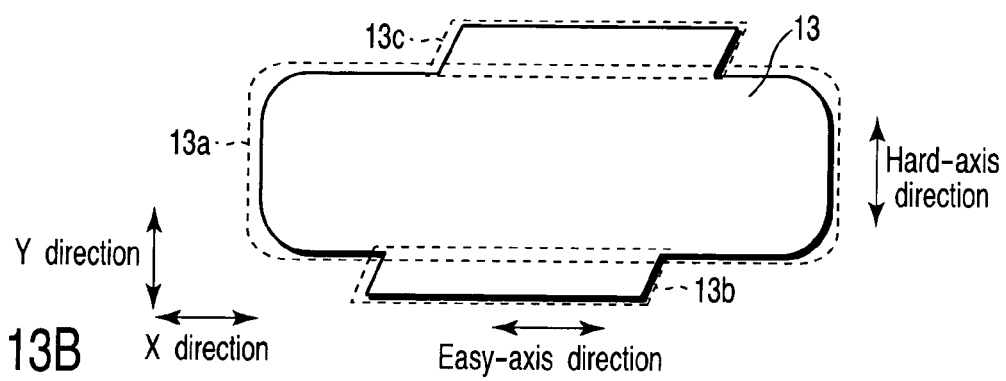
Figure 13C:
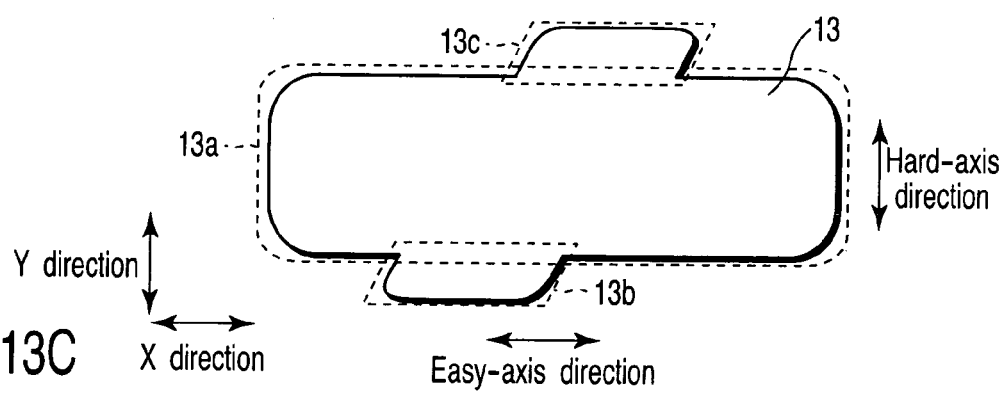

As shown in FIGS. 13B and 13C, the projecting portions 13b and 13c may project from the side surfaces of the running portion 13a obliquely with respect to the Y direction. That is, the recording layer may have the shape of an ellipse and a parallelogram which cross each other.

Figure 13D:
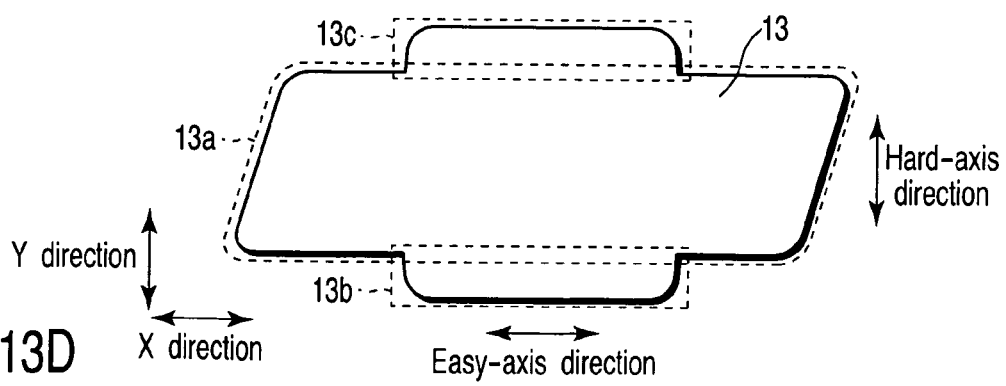

As shown in FIG. 13D, the running portion 13a which runs in the X direction may be a parallelogram having rounded corners. The projecting portions 13b and 13c which project in the Y direction from the Y-direction (direction of axis of hard magnetization) side surfaces of the running portion 13a may be self-aligned with respect to the side surface portions of the running portion 13a.

Even with the planar shape of the recording layer 13 according to the fifth embodiment, the same effect as in the first embodiment can be obtained.

Sixth Embodiment

In the sixth embodiment, examples of the shape of the fixed layer of an MTJ element will be described. The shapes of the fixed layer according to this embodiment can be applied to other embodiments.

FIGS. 14A and 14B and FIGS. 15A and 15B are plan and perspective views of the fixed layer according to the sixth embodiment of the present invention. The planar of the fixed layer is not limited to that of the first to fourth embodiments and can be variously changed, as will be described below.

Figure 14A:
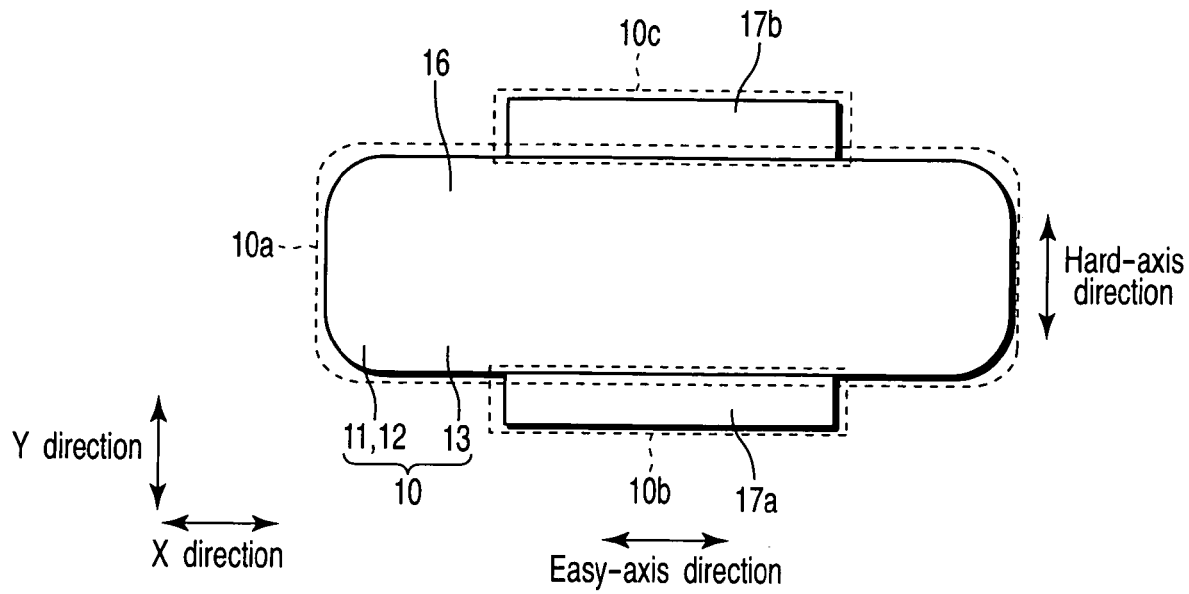
Figure 14B:
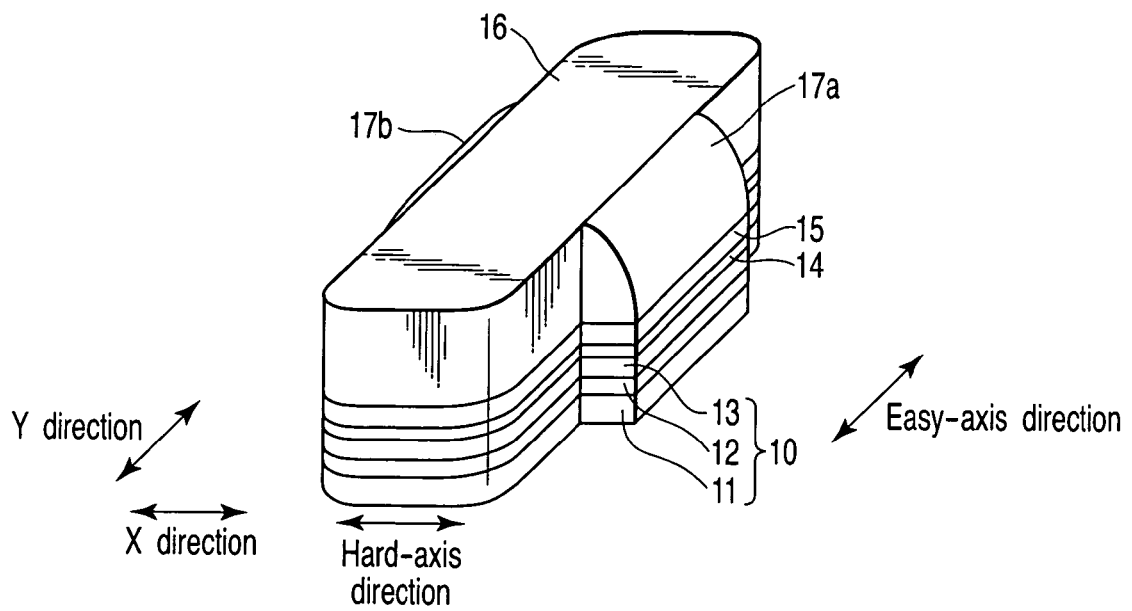

As shown in FIGS. 14A and 14B, a fixed layer 11 may have the same planar shape as a recording layer 13. More specifically, the fixed layer 11, nonmagnetic layer 12, and recording layer 13 have the same cross shape, and all of their side surfaces match each other.

Figure 15A:
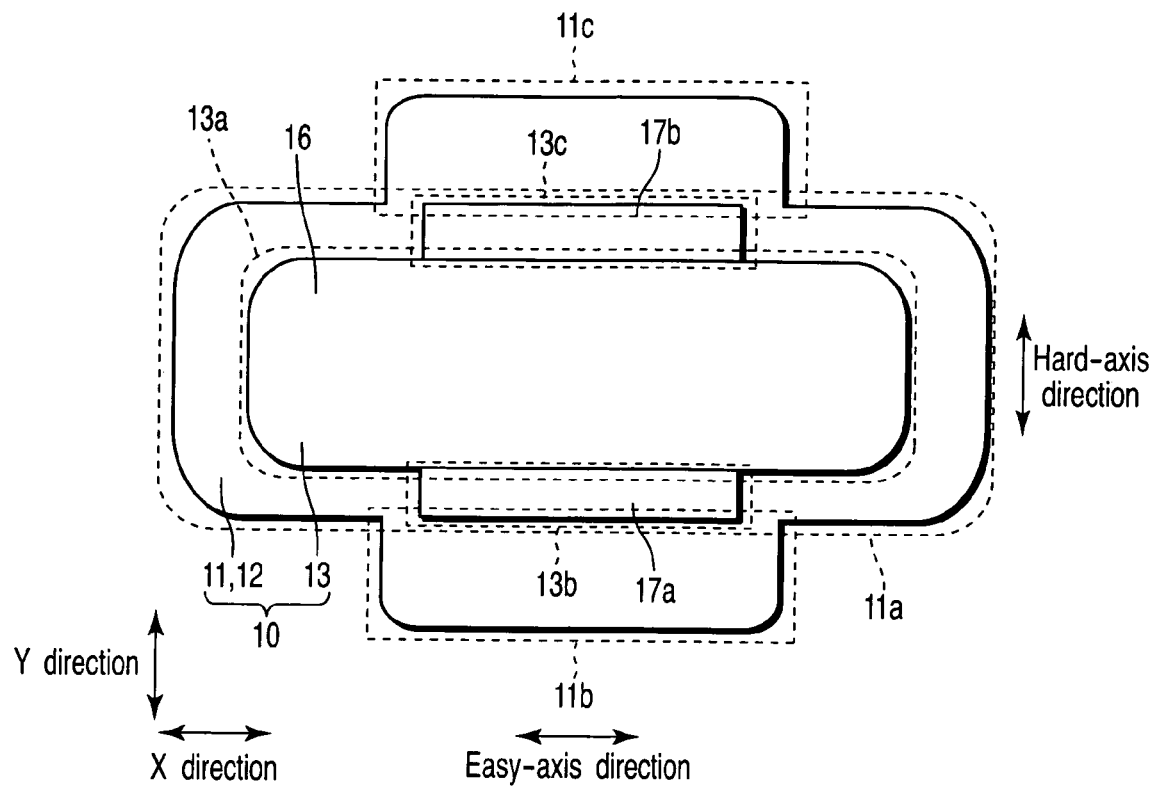
Figure 15B:
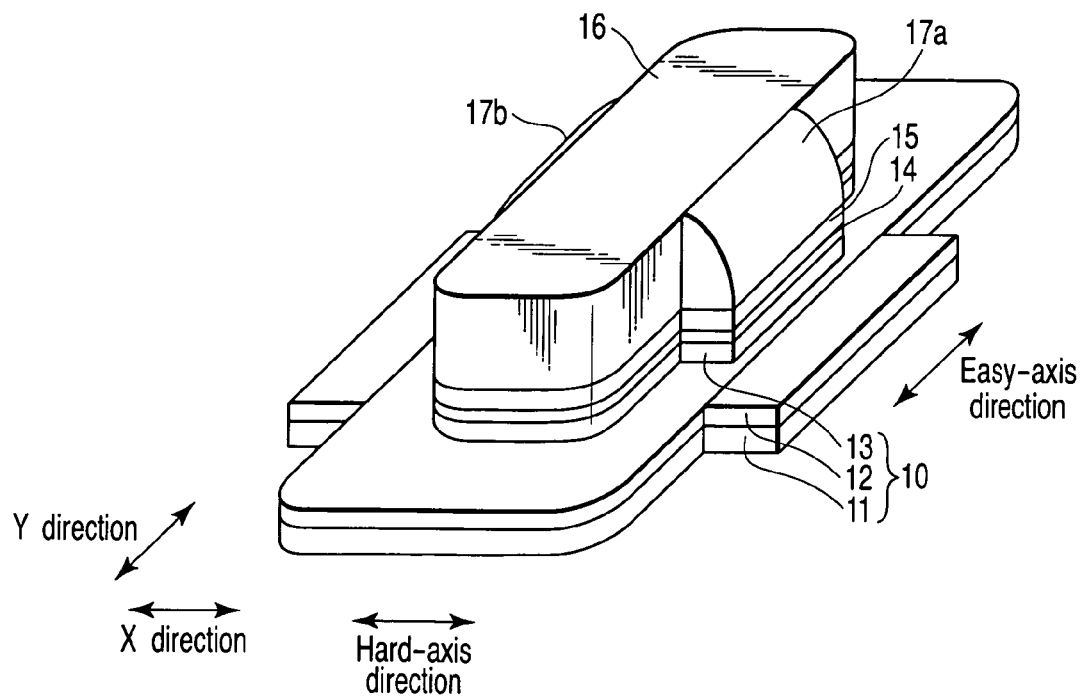

As shown in FIGS. 15A and 15B, the fixed layer 11 may have a cross planar shape larger than the recording layer 13. In this case, the fixed layer 11 includes a running portion 11a which runs in the X direction (direction of axis of easy magnetization), and projecting portions 11b and 11c which project in the Y direction from the Y-direction (direction of axis of hard magnetization) side surfaces of the running portion 11a. When a sidewall layer is further provided around the recording layer 13, the fixed layer 11 can be self-aligned into a cross shape with respect to the recording layer 13. For the sidewall layer, a material such as SiN or AlO is preferably used.

Even with the shape of the fixed layer 11 according to the sixth embodiment, the same effect as in the first embodiment can be obtained.

Seventh Embodiment

In the seventh embodiment, as structural examples of the MTJ element, (a) a tunnel junction structure and (b) an interlayer exchange coupling structure will be described. The structures of the MTJ element according to this embodiment can be applied to other embodiments.

(a) Tunnel Junction Structure

FIGS. 16A and 16B are sectional views of the tunnel junction structures of the MTJ element according to the seventh embodiment of the present invention. The MTJ element is not limited to the single junction structure of the first to fourth embodiments and can be variously changed, as will be described below.

As shown in FIGS. 16A and 16B, an MTJ element 10 may have a double tunnel junction structure including two nonmagnetic layers 12-1 and 12-2 which function as tunnel junction layers. More specifically, a first fixed layer 11-1 is provided at one end of a recording layer 13 through the first nonmagnetic layer 12-1. A second fixed layer 11-2 is provided at the other end of the recording layer 13 through the second nonmagnetic layer 12-2.

All the layers included in the MTJ element 10 may have the same cross shape, as shown in FIG. 16A. Alternatively, as shown in FIG. 16B, the planar shape of the first fixed layer 11-1 and first nonmagnetic layer 12-1 may be larger than the cross planar shape of the recording layer 13, second nonmagnetic layer 12-2, and second fixed layer 11-2 and may be either a rectangular or cross shape.

According to the MTJ element 10 having the double junction structure according to the seventh embodiment, the same effect as in the first embodiment can be obtained. In addition, when the MTJ element 10 has the double junction structure, the bias voltage per tunnel junction is ½ the applied voltage, as compared to the single junction structure. Hence, any decrease in magnetoresistive (MR) ratio caused by an increase in bias voltage can be suppressed.

(b) Interlayer Exchange Coupling Structure

FIGS. 17A to 17H are sectional views of the interlayer exchange coupling structures of the MTJ element according to the seventh embodiment of the present invention. The fixed layer and recording layer of the MTJ element are not limited to the single-layer structure of the first to fourth embodiments and can be variously changed, as will be described below.

As shown in FIGS. 17A to 17H, at least one of the fixed layer 11 and recording layer 13 of the MTJ element 10 may have an anti-ferromagnetic coupling structure or ferromagnetic coupling structure. In the anti-ferromagnetic coupling structure, interlayer exchange coupling occurs such that the magnetization directions of the two ferromagnetic layers sandwiching the nonmagnetic layer are anti-parallel (directed in reverse directions). In the ferromagnetic coupling structure, interlayer exchange coupling occurs such that the magnetization directions of the two ferromagnetic layers sandwiching the nonmagnetic layer are parallel (directed in the same direction).

Figure 17A:
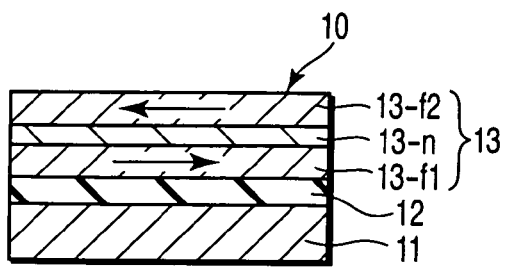
FIGS. 17A to 17H are sectional views showing interlayer exchange coupling structures of the MTJ element according to the seventh embodiment of the present invention.

In the MTJ element 10 shown in FIG. 17A, the recording layer 13 has the anti-ferromagnetic coupling structure. More specifically, the recording layer 13 has a three-layered structure including a ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the anti-parallel state.

Figure 17B:
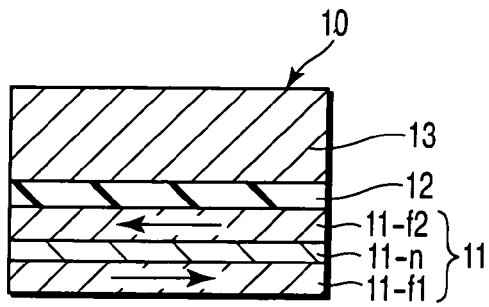

In the MTJ element 10 shown in FIG. 17B, the fixed layer 11 has the anti-ferromagnetic coupling structure. More specifically, the fixed layer 11 has a three-layered structure including a ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the anti-parallel state.

Figure 17C:
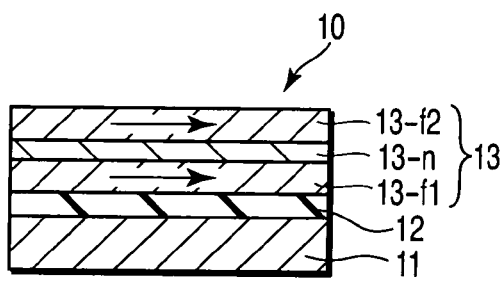

In the MTJ element 10 shown in FIG. 17C, the recording layer 13 has the ferromagnetic coupling structure. More specifically, the recording layer 13 has the three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the parallel state.

Figure 17D:
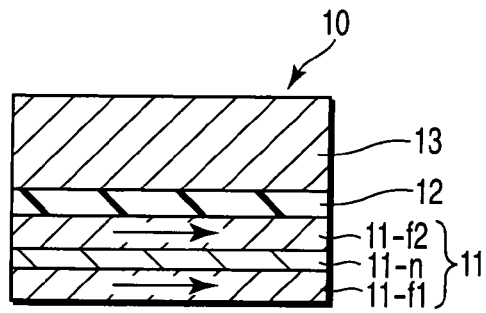

In the MTJ element 10 shown in FIG. 17D, the fixed layer 11 has the ferromagnetic coupling structure. More specifically, the fixed layer 11 has the three-layered structure including the ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the parallel state.

Figure 17E:
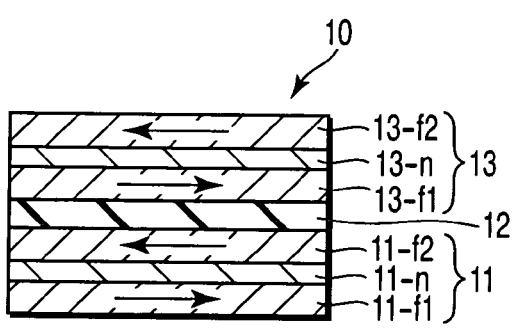

In the MTJ element 10 shown in FIG. 17E, both the recording layer 13 and the fixed layer 11 have the anti-ferromagnetic coupling structure. More specifically, the recording layer 13 has the three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the anti-parallel state. The fixed layer 11 has the three-layered structure including the ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the anti-parallel state.

Figure 17F:
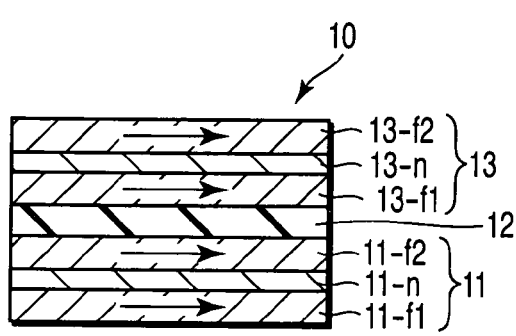

In the MTJ element 10 shown in FIG. 17F, both the recording layer 13 and the fixed layer 11 have the ferromagnetic coupling structure. More specifically, the recording layer 13 has the three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the parallel state. The fixed layer 11 has the three-layered structure including the ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the parallel state.

Figure 17G:
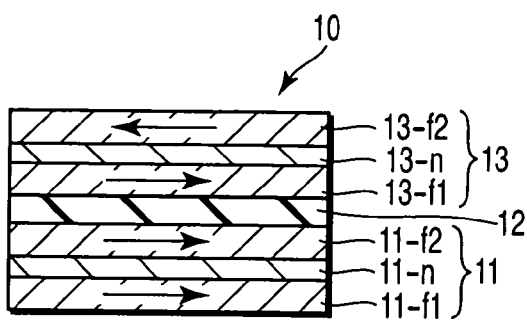

In the MTJ element 10 shown in FIG. 17G, the recording layer 13 has the anti-ferromagnetic coupling structure, and the fixed layer 11 has the ferromagnetic coupling structure. More specifically, the recording layer 13 has the three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the anti-parallel state. The fixed layer 11 has the three-layered structure including the ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the parallel state.

Figure 17H:
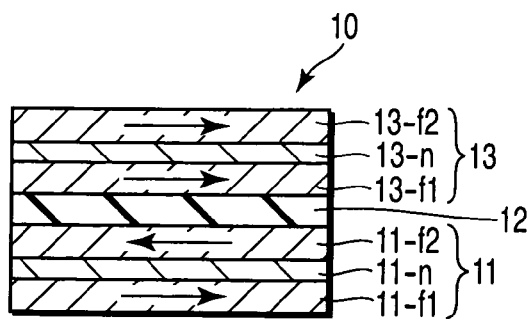

In the MTJ element 10 shown in FIG. 17H, the recording layer 13 has the ferromagnetic coupling structure, and the fixed layer 11 has the anti-ferromagnetic coupling structure. More specifically, the recording layer 13 has the three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the parallel state. The fixed layer 11 has the three-layered structure including the ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the anti-parallel state.

The MTJ element 10 having a single junction structure has been described with reference to FIGS. 17A to 17H. However, this embodiment can also be applied to the MTJ element 10 having a double junction structure. The fixed layer 11 and recording layer 13 need not always have a three-layered structure including a ferromagnetic layer, nonmagnetic layer, and ferromagnetic layer. The number of layers may be increased.

According to the MTJ element 10 having the interlayer exchange coupling structure of the seventh embodiment, the same effect as in the first embodiment can be obtained. Since the MTJ element 10 has the interlayer exchange coupling structure, field leakage can be reduced as compared to an MTJ element whose fixed layer 11 and recording layer 13 have a single-layer structure.

Eighth Embodiment

In the eighth embodiment, a magnetic random access memory in which the MTJ element 10 according to one of the above embodiments is used as a memory element, and a plurality of MTJ elements are laid out in an array will be described. As examples of the memory cell structure, (a) a select transistor cell, (b) a select diode cell, (c) a cross-point cell, and (d) a toggle cell will be described below.

(a) Select Transistor

FIGS. 18A and 18B show a select transistor memory cell of a magnetic random access memory according to the eighth embodiment of the present invention. The select transistor cell structure will be described below.

As shown in FIGS. 18A and 18B, one cell MC having a select transistor structure includes one MTJ element 10, transistor (e.g., MOS transistor) Tr connected to the MTJ element 10, bit line (BL) 28, and word line (WWL) 26. A memory cell array MCA is formed by laying out a plurality of memory cells MC in an array.

More specifically, one terminal of the MTJ element 10 is connected to one end (drain diffusion layer) 23a of the current path of the transistor Tr through a base metal layer 27, contacts 24a, 24b, and 24c, and wirings 25a and 25b. The other terminal of the MTJ element 10 is connected to the bit line 28 through a mask layer 16. The write word line 26 electrically isolated from the MTJ element 10 is provided under the MTJ element 10. The other end (source diffusion layer) 23b of the current path of the transistor Tr is connected to, e.g., ground through a contact 24d and wiring 25c. A gate electrode 22 of the transistor Tr functions as a read word line (RWL).

One terminal of the MTJ element 10 on the side of the base metal layer 27 is, e.g., a fixed layer 11. The other terminal of the MTJ element 10 on the side of the bit line 28 is, e.g., a recording layer 13. This arrangement may be reversed. The method of connecting the MTJ element 10 and bit line 28 can be changed as in the first, third, or fourth embodiment. The MTJ element 10 can be laid out while setting the direction of axis of easy magnetization along the running direction of the bit line 28 or along the running direction of the word line 26.

In the select transistor memory cell, the data write and read are executed in the following way.

The write operation is executed in the following way. The write word line 26 and bit line 28 corresponding to a selected one of the plurality of MTJ elements 10 are selected. When write currents Iw1 and Iw2 are supplied to the selected write word line 26 and bit line 28, a synthetic field H by the write currents Iw1 and Iw2 is applied to the MTJ element 10. Accordingly, the magnetization of the recording layer 13 of the MTJ element 10 is reversed to create a state in which the magnetization directions of the fixed layer 11 and recording layer 13 are parallel or anti-parallel. For example, when the parallel state is defined as a "1" state, and the anti-parallel state is defined as a "0" state, a binary data write is implemented.

The read operation is executed in the following way by using the transistor Tr which functions as a read switching element. The bit line 28 and read word line (RWL) corresponding to the selected MTJ element 10 are selected. A read current Ir which tunnels a nonmagnetic insulating layer 12 of the MTJ element 10 is supplied. The junction resistance value changes in proportion to the cosine of the relative angle of the magnetizations of the fixed layer 11 and recording layer 13. When the magnetization of the MTJ element 10 is in the parallel state (e.g., "1" state), the resistance is low. In the anti-parallel state (e.g., "0" state), the resistance is high. That is, a tunneling magnetoresistive (TMR) effect is obtained. The "1" or "0" state of the MTJ element 10 is determined by reading the difference in resistance value.

(b) Select Diode

Figure 19A:
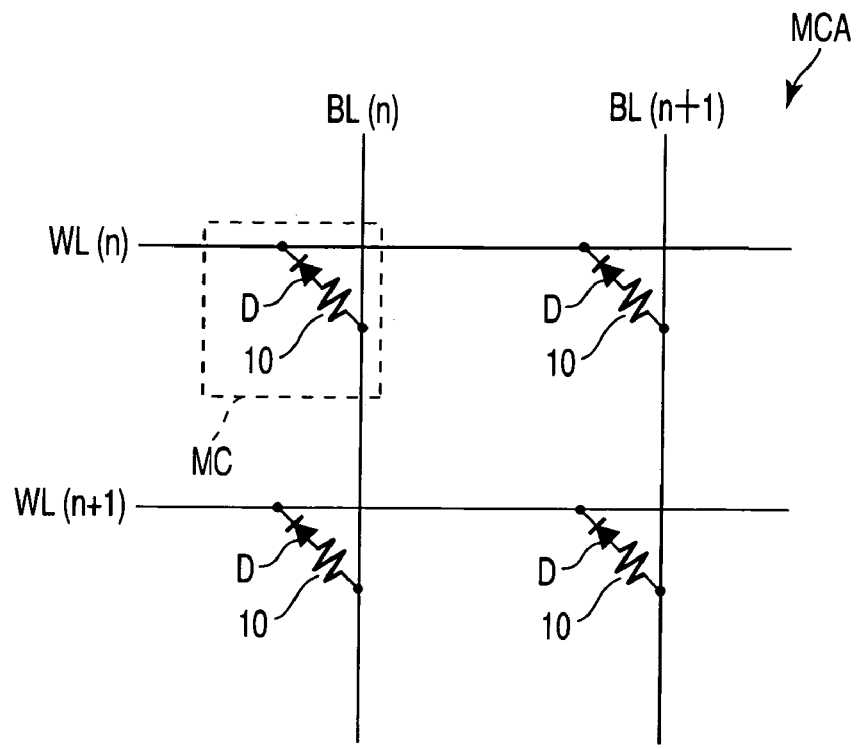
Figure 19B:
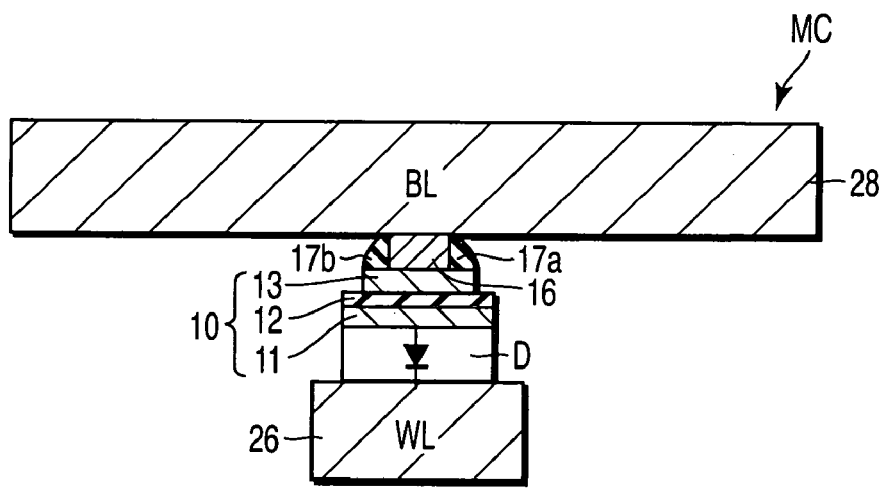
Figure 19B:
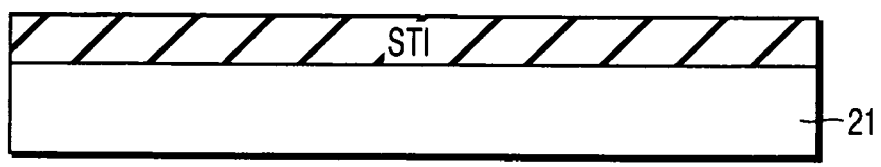

FIGS. 19A and 19B show a select diode memory cell of the magnetic random access memory according to the eighth embodiment of the present invention. The select diode cell structure will be described below.

As shown in FIGS. 19A and 19B, one cell MC having a select diode structure includes one MTJ element 10, a diode D connected to the MTJ element, the bit line (BL) 28, and the word line (WL) 26. The memory cell array MCA is formed by laying out a plurality of memory cells MC in an array.

The diode D is, e.g., a p-n junction diode including a p-type semiconductor layer and n-type semiconductor layer. One terminal (e.g., p-type semiconductor layer) of the diode D is connected to the MTJ element 10. The other terminal (e.g., n-type semiconductor layer) of the diode D is connected to the word line 26. In the structure shown in FIGS. 19A and 19B, a current flows from the bit line 28 to the word line 26.

The location or direction of the diode D can be variously changed. For example, the diode D may be arranged in a direction to supply a current from the word line 26 to the bit line 28. The diode D may be formed in a semiconductor substrate 21. The diode D may be a Schottky barrier diode including a semiconductor layer and metal layer.

The data write operation of the select diode memory cell is the same as that of the select transistor cell. The write currents Iw1 and Iw2 are supplied to the bit line 28 and word line 26 to set the magnetization of the MTJ element 10 in the parallel or anti-parallel state.

The data read operation is also almost the same as that of the select transistor cell. In the select diode cell, the diode D is used as a read switching element. More specifically, the biases of the bit line 28 and word line 26 are controlled by using the rectifying effect of the diode D such that an unselected MTJ element has a reverse bias. Accordingly, the read current Ir is supplied to only the selected MTJ element 10.

(c) Cross-Point

FIGS. 20A and 20B show a cross-point memory cell of the magnetic random access memory according to the eighth embodiment of the present invention. The cross-point cell structure will be described below.

As shown in FIGS. 20A and 20B, one cell MC having a cross-point structure includes one MTJ element 10, bit line 28, and word line 26. The memory cell array MCA is formed by laying out a plurality of memory cells MC in an array.

More specifically, the MTJ element 10 is arranged near the intersection between the bit line 28 and the word line 26. One terminal of the MTJ element 10 is connected to the word line 26. The other terminal of the MTJ element 10 is connected to the bit line 28 through the mask layer 16.

The data write operation of the cross-point memory cell is the same as that of the select transistor cell. The write currents Iw1 and Iw2 are supplied to the bit line 28 and word line 26 to set the magnetization of the MTJ element 10 in the parallel or anti-parallel state. In the data read operation, the read current Ir is supplied to the bit line 28 and word line 26 connected to the selected MTJ element 10, thereby reading out the data of the MTJ element 10.

(d) Toggle

FIG. 21 is a plan view showing a toggle memory cell of the magnetic random access memory according to the eighth embodiment of the present invention. The toggle cell structure will be described below.

As shown in FIG. 21, in the toggle cell, the MTJ element 10 is laid out such that its axis of easy magnetization is tilted with respect to the running direction (X direction) of the bit line 28 or the running direction (Y direction) of the word line 26, i.e., with respect to the direction of write current Iw1 to be supplied to the bit line 28 or the direction of write current Iw2 to be supplied to the word line 26. The tilt of the MTJ element 10 is, e.g., 30° to 60°, and preferably, 45°.

In the toggle memory cell, the data write and read are executed in the following way.

The write operation is executed in the following way. In a toggle write, before arbitrary data is written in a selected cell, the data of the selected cell is read out. If it is determined by reading out the data of the selected cell that the arbitrary data has already been written, no write is executed. If data different from the arbitrary data has been written, the write is executed to rewrite the data.

After the above-described confirmation cycle, if data must be written in the selected cell, two write wirings (bit line 28 and word line 26) are sequentially turned on. The write wiring which has been turned on first is turned off first. Then, the write wiring which has been turned on later is turned off. For example, the procedures include four cycles: the word line 26 is turned on to supply the write current Iw2→the bit line 28 is turned on to supply the write current Iw1→the word line 26 is turned off to stop supplying the write current Iw2→the bit line 28 is turned off to stop supplying the write current Iw1.

In the data read operation, the read current Ir is supplied to the bit line 28 and word line 26 connected to the selected MTJ element 10, thereby reading out the data of the MTJ element 10.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A magnetic random access memory comprising:
a magnetic recording element which includes a fixed layer whose magnetization direction is fixed, a recording layer whose magnetization direction changes, and a nonmagnetic layer provided between the fixed layer and the recording layer, the recording layer having a first running portion, a first projecting portion and a second projecting portion, the first running portion which runs in a direction of axis of easy magnetization, the first and second projecting portions which project from two side surfaces of the first running portion, a first length of the first projecting portion in a first projecting direction being substantially equal to a second length of the second projecting portion in a second projecting direction, a planar shape of the recording layer being a cross shape, a planar shape of the first running portion being an ellipse;
a mask layer which is arranged above the first running portion, a planar shape of the mask layer being the same as a planar shape of the first running portion;
a first sidewall layer and a second sidewall layer which are formed on two side surfaces of the mask layer, respectively, oppose via the mask layer, and arranged on the first projecting portion and the second projecting portion, respectively, a material of the first sidewall layer and the second sidewall layer being different from materials of the mask layer and an interlayer insulating film formed around the magnetic recording element, a planar shape of the first sidewall layer and the second sidewall layer being the same as a planar shape of the first projecting portion and the second projecting portion, the mask layer, the first sidewall layer and the second sidewall layer being made of an insulating material;
a via which extends through the mask layer and is connected to the magnetic recording element; and
a wiring which is connected to the via.

2. The memory according to claim 1, wherein the via partially overlaps one of the first sidewall layer and the second sidewall layer.

3. The memory according to claim 1, wherein the projecting portion has rounded corners.

4. The memory according to claim 1, wherein the first projecting portion and the second projecting portion project from the two side surfaces of the first running portion in a direction of axis of hard magnetization or project from the two side surfaces of the first running portion while tilting with respect to the direction of axis of hard magnetization.

5. The memory according to claim 1, wherein a planar shape of the fixed layer and the nonmagnetic layer is the same as a planar shape of the recording layer.

6. The memory according to claim 1, wherein a planar shape of the fixed layer and the nonmagnetic layer is larger than a planar shape of the recording layer,
each of the fixed layer and the nonmagnetic layer has a second running portion, a third projecting portion and a fourth projecting portion,
the second running portion runs in the direction of axis of easy magnetization, and the third and fourth projecting portions project from two side surfaces of the second running portion.

7. The memory according to claim 1, wherein at least one of the fixed layer and the recording layer comprises
a first ferromagnetic layer,
a second ferromagnetic layer, and
a nonmagnetic insulating layer which is provided between the first ferromagnetic layer and the second ferromagnetic layer.

8. A magnetic random access memory comprising:
a magnetic recording element which includes a fixed layer whose magnetization direction is fixed, a recording layer whose magnetization direction changes, and a nonmagnetic layer provided between the fixed layer and the recording layer, the recording layer having a first running portion, a first projecting portion and a second projecting portion, the first running portion which runs in a direction of axis of easy magnetization, the first and second projecting portions which project from two side surfaces of the first running portion, a first length of the first projecting portion in a first projecting direction being substantially equal to a second length of the second projecting portion in a second projecting direction, a planar shape of the recording layer being a cross shape, a planar shape of the first running portion being an ellipse;
a mask layer which is arranged above the first running portion, a planar shape of the mask layer being the same as a planar shape of the first running portion; and
a first sidewall layer and a second sidewall layer which are formed on two side surfaces of the mask layer, respectively, oppose via the mask layer, and arranged on the first projecting portion and the second projecting portion, respectively, a material of the first sidewall layer and the second sidewall layer being different from materials of the mask layer and an interlayer insulating film formed around the magnetic recording element, a planar shape of the first sidewall layer and the second sidewall layer being the same as a planar shape of the first projecting portion and the second projecting portion, and
wherein the first projecting portion and the second projecting portion project from the two side surfaces of the first running portion in a direction of axis of hard magnetization or project from the two side surfaces of the first running portion while tilting with respect to the direction of axis of hard magnetization.

9. The memory according to claim 8, in which
the mask layer is made of a conductive material, and the first sidewall layer and the second sidewall layer are made of an insulating material, and
which further comprises a wiring which is connected directly to the mask layer.

10. The memory according to claim 8, in which
the mask layer is made of an insulating material, and the first sidewall layer and the second sidewall layer are made of a conductive material, and
which further comprises a wiring which is connected directly to the first sidewall layer and the second sidewall layer.

11. The memory according to claim 8, wherein the first sidewall layer and the second sidewall layer are made of a magnetic material.

12. The memory according to claim 11, further comprising a wiring which is provided on the mask layer, and
a yoke layer which is provided on upper and side surfaces of the wiring, is in contact with the first sidewall layer and the second sidewall layer, and is made of a magnetic material.

13. The memory according to claim 8, wherein the projecting portion has rounded corners.

14. The memory according to claim 8, wherein a planar shape of the fixed layer and the nonmagnetic layer is the same as a planar shape of the recording layer.

15. A magnetic random access memory comprising:
a magnetic recording element which includes a fixed layer whose magnetization direction is fixed, a recording layer whose magnetization direction changes, and a nonmagnetic layer provided between the fixed layer and the recording layer, the recording layer having a first running portion, a first projecting portion and a second projecting portion, the first running portion which runs in a direction of axis of easy magnetization, the first and second projecting portions which project from two side surfaces of the first running portion, a first length of the first projecting portion in a first projecting direction being substantially equal to a second length of the second projecting portion in a second projecting direction, a planar shape of the recording layer being a cross shape, a planar shape of the first running portion being an ellipse;

a mask layer which is arranged above the first running portion, a planar shape of the mask layer being the same as a planar shape of the first running portion; and a first sidewall layer and a second sidewall layer which are formed on two side surfaces of the mask layer, respectively, oppose via the mask layer, and arranged on the first projecting portion and the second projecting portion, respectively, a material of the first sidewall layer and the second sidewall layer being different from materials of the mask layer and an interlayer insulating film formed around the magnetic recording element, a planar shape of the first sidewall layer and the second sidewall layer being the same as a planar shape of the first projecting portion and the second projecting portion, and wherein a planar shape of the fixed layer and the nonmagnetic layer is larger than a planar shape of the recording layer, each of the fixed layer and the nonmagnetic layer has a second running portion, a third projecting portion and a fourth projecting portion, the second running portion runs in the direction of axis of easy magnetization, and the third and fourth projecting portions project from two side surfaces of the second running portion.

16. The memory according to claim 15, in which
the mask layer is made of a conductive material, and the first sidewall layer and the second sidewall layer are made of an insulating material, and
which further comprises a wiring which is connected directly to the mask layer.

17. The memory according to claim 15, in which
the mask layer is made of an insulating material, and the first sidewall layer and the second sidewall layer are made of a conductive material, and
which further comprises a wiring which is connected directly to the first sidewall layer and the second sidewall layer.

18. The memory according to claim 15, wherein the first sidewall layer and the second sidewall layer are made of a magnetic material.

19. The memory according to claim 18, further comprising a wiring which is provided on the mask layer, and
a yoke layer which is provided on upper and side surfaces of the wiring, is in contact with the first sidewall layer and the second sidewall layer, and is made of a magnetic material.

20. The memory according to claim 15, wherein the projecting portion has rounded corners.

* * * * *